(12) United States Patent
Guo

(10) Patent No.: US 12,096,599 B2
(45) Date of Patent: Sep. 17, 2024

(54) HEAT SINK ASSEMBLY AND CONTROL METHOD FOR HEAT SINK ASSEMBLY, AND ELECTRONIC DEVICE AND MANUFACTURING METHOD FOR ELECTRONIC DEVICE

(71) Applicant: BEIJING XIAOMI MOBILE SOFTWARE CO., LTD., Beijing (CN)

(72) Inventor: Yiwei Guo, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 263 days.

(21) Appl. No.: 17/144,605

(22) Filed: Jan. 8, 2021

(65) Prior Publication Data
US 2021/0410321 A1   Dec. 30, 2021

(30) Foreign Application Priority Data

Jun. 30, 2020   (CN) .......................... 202010620369.8

(51) Int. Cl.
*H05K 7/20*   (2006.01)
*H01F 7/06*   (2006.01)
*H05K 5/02*   (2006.01)

(52) U.S. Cl.
CPC .......... *H05K 7/2039* (2013.01); *H01F 7/064* (2013.01); *H05K 5/0217* (2013.01)

(58) Field of Classification Search
CPC ............. H05K 7/2039; H05K 7/20136; H05K 5/0217; H01F 7/064; F04B 45/04;
(Continued)

(56) References Cited

U.S. PATENT DOCUMENTS 5,522,712 A *   6/1996   Winn ...................... F04D 33/00
                                                                415/125
6,043,978 A     3/2000   Mody
(Continued)

FOREIGN PATENT DOCUMENTS

CN        103369916 A    10/2013
CN        103423174 A    12/2013
(Continued)

OTHER PUBLICATIONS

Jeung Sang Go, Design of a microfin array heat sink using flow-induced vibration to enhance the heat transfer in the laminar flow regime, Sensors and Actuators A: Physical, vol. 105, Issue 2, 2003, pp. 201-210, ISSN 0924-4247, https://doi.org/10.1016/S0924-4247(03)00101-8 (Year: 2003).*

(Continued)

*Primary Examiner* — Thienvu V Tran
*Assistant Examiner* — Sreeya Sreevatsa
(74) *Attorney, Agent, or Firm* — Cooper Legal Group, LLC

(57)   ABSTRACT

The present disclosure relates to a heat sink assembly and control method, and an electronic device and manufacturing method. The heat sink assembly includes: a vibrating plate including a magnetic material; a vibrating film, one end of which is connected with the vibrating plate; a driving device having an electromagnet, which is arranged opposite to the vibrating plate; a control circuit which is connected with the driving device and is configured for transmitting to the driving device a control signal for controlling the electromagnet to be energized and de-energized. The electromagnet generates a magnetic field that drives the vibrating plate to vibrate when the electromagnet is alternately switched between an energized state and a de-energized state. The (Continued)

vibrating film vibrates with the vibration of the vibrating plate.

11 Claims, 9 Drawing Sheets

(58) Field of Classification Search
CPC ............ F04D 33/00; H02K 33/02; F04F 7/00; H04M 1/026
USPC ........................................................ 361/152
See application file for complete search history.

(56) References Cited

U.S. PATENT DOCUMENTS

| | | | |
|---|---|---|---|
| 9,163,624 B2 | 10/2015 | Chen | |
| 2006/0138875 A1* | 6/2006 | Kim | F04D 33/00 310/15 |
| 2009/0072637 A1 | 3/2009 | Chang | |
| 2009/0213555 A1 | 8/2009 | Wang | |
| 2013/0258589 A1* | 10/2013 | Yu | H05K 7/20172 165/47 |
| 2013/0309107 A1* | 11/2013 | Chen | F04B 45/047 417/410.1 |
| 2015/0055295 A1* | 2/2015 | Chang | G06F 1/203 361/691 |
| 2015/0152859 A1* | 6/2015 | Tsai | F04D 33/00 416/3 |
| 2015/0173241 A1* | 6/2015 | Hsu | H05K 7/20209 165/104.34 |
| 2019/0075680 A1* | 3/2019 | Feng | F04D 25/0606 |
| 2021/0111654 A1* | 4/2021 | Ishitani | H02P 25/032 |

FOREIGN PATENT DOCUMENTS

| | | | |
|---|---|---|---|
| CN | 104853562 A | | 8/2015 |
| JP | H03116961 A | | 5/1991 |
| JP | 2009088571 A | * | 4/2009 |
| JP | 3186976 U | | 10/2013 |
| TW | 201122320 A | * | 7/2011 |
| TW | 201340853 A | | 10/2013 |
| TW | 201346143 A | | 11/2013 |
| WO | 2006068364 A1 | | 6/2006 |

OTHER PUBLICATIONS

Supplementary European Search Report in the European application No. 21155283.1, mailed on Jul. 22, 2021, 7 pgs.
"Cool down—Red Devils 3/3s—Nubian Red Devils community", Jun. 2019, reprinted from the Internet at: https://bbs.nubia.com/forum.php?mod=viewthread&tid=1490634&extra=page1&page=1&, 5 pgs.
"There's a fan in your phone? Nubia Red Devils 3 game mobile phone disassemble, see how to do super heat", Dec. 2019, reprinted from the Internet at: https://www.cirmall.com/articles/31737, 21 pgs.
First Office Action of the Chinese application No. 202010620369.8, issued on Jan. 10, 2024, 20 pages with English translation.

* cited by examiner

HEAT SINK ASSEMBLY AND CONTROL METHOD FOR HEAT SINK ASSEMBLY, AND ELECTRONIC DEVICE AND MANUFACTURING METHOD FOR ELECTRONIC DEVICE

CROSS-REFERENCE TO RELATED APPLICATIONS

The present application is based upon and claims priority to Chinese Patent Application No. 202010620369.8, filed on Jun. 30, 2020, the entire contents of which are incorporated herein by reference.

TECHNICAL FIELD

The present disclosure relates to the field of machinery, and more particularly, to a heat sink assembly and a control method for the heat sink assembly, and an electronic device and a manufacturing method for the electronic device.

BACKGROUND

With the upgrade of intelligent hardware and the increasing power consumption of electronic devices, heat generation has become one of the main problems that impede the improvement of electronic device performance and consumer experience. In order to make an electronic device run well, the heat dissipation of the electronic device becomes particularly important. At present, the main heat dissipation solutions are graphite plate heat dissipation, liquid cooling heat dissipation, heat pipe heat dissipation, soaking plate heat dissipation, etc. How to optimize the heat dissipation design still needs to continuous exploration.

SUMMARY

The present disclosure provides a heat sink assembly and a control method for the heat sink assembly, and an electronic device and a manufacturing method for the electronic device.

According a first aspect of the embodiments of the present disclosure, a heat sink assembly is provided, which may include: a vibrating plate, a vibrating film, a driving device and a control circuit.

The vibrating plate includes a magnetic material.

One end of the vibrating film is connected with the vibrating plate.

The driving device has an electromagnet which is arranged opposite to the vibrating plate.

The control circuit is connected with the driving device and is configured for transmitting to the driving device a control signal for controlling the electromagnet to be energized and de-energized.

The electromagnet generates a magnetic field that drives the vibrating plate to vibrate when the electromagnet is alternately switched between an energized state and a de-energized state.

The vibrating film vibrates with the vibration of the vibrating plate.

According to a second aspect of the embodiments of the present disclosure, a control method is provided, which is applied to the heat sink assembly described in any above embodiment. The control method may include the following operations.

A periodic control signal, which controls the electromagnet to be energized and de-energized alternately, is sent by the control circuit.

The electromagnet generates a variable magnetic field that drives the vibrating plate to vibrate during the energizing and the de-energizing of the electromagnet. The variable magnetic field drives the vibrating plate including the magnetic material to move to drive the vibrating film connected with the vibrating plate.

According a third aspect of the embodiments of the present disclosure, an electronic device is provided, which may include the heat sink assembly described in any above embodiment, a shell and a cover plate.

An end of the vibrating plate, which is away from an end of the vibrating plate connected with the vibrating film, is fixed on the shell, and another end of the vibrating film, which is away from an end of the vibrating film connected with the vibrating plate, is fixed on the shell.

The cover plate is arranged on the shell. The driving device is arranged at an inner side of the cover plate facing the shell, and the vibrating plate and the vibrating film are located between the cover plate and the shell.

According to a fourth aspect of the embodiments of the present disclosure, a manufacturing method is provided, which is applied to the electronic device described in any above embodiment. The manufacturing method may include the following operations.

The vibrating plate and the vibrating film are connected.

The end of the vibrating plate, which is away from the end of the vibrating plate connected with the vibrating film, is fixed in the shell.

Another end of the vibrating film, which is away from an end of the vibrating film connected with the vibrating plate, is fixed in the shell.

The control circuit and the driving device are connected.

The driving device is fixed on the cover plate.

The cover plate fixed with the driving device is installed on the shell. The cover plate is covered on the vibrating plate and the vibrating film, and the driving device is arranged opposite to the vibrating plate.

It is to be understood that the above general descriptions and detailed descriptions below are only exemplary and explanatory and not intended to limit the present disclosure.

BRIEF DESCRIPTION OF THE DRAWINGS

The accompanying drawings, which are incorporated in and constitute a part of this description, illustrate embodiments consistent with the present disclosure and, together with the description, serve to explain the principles of the present disclosure.

DETAILED DESCRIPTION

Figure 1:
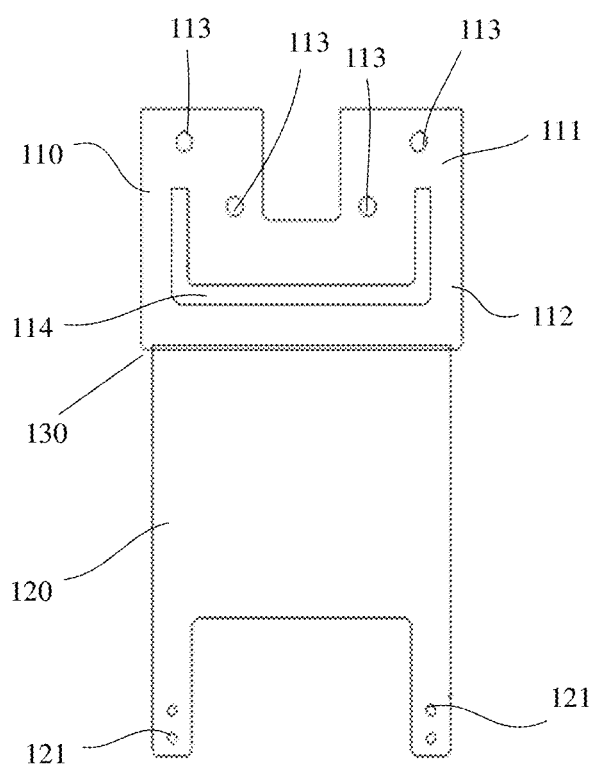
FIG. 1 is a diagram of a heat sink assembly according to some embodiments of the disclosure, in which a vibrating plate and a vibrating film of the heat sink assembly are connected.

Reference will now be made in detail to exemplary embodiments, examples of which are illustrated in the accompanying drawings. The following description refers to the accompanying drawings in which the same reference numerals in different drawings represent the same or similar elements unless otherwise represented. The implementations set forth in the following description of exemplary embodiments do not represent all implementations consistent with the present disclosure. Instead, they are merely examples of devices consistent with aspects related to the present disclosure as recited in the appended claims.

Figure 4:
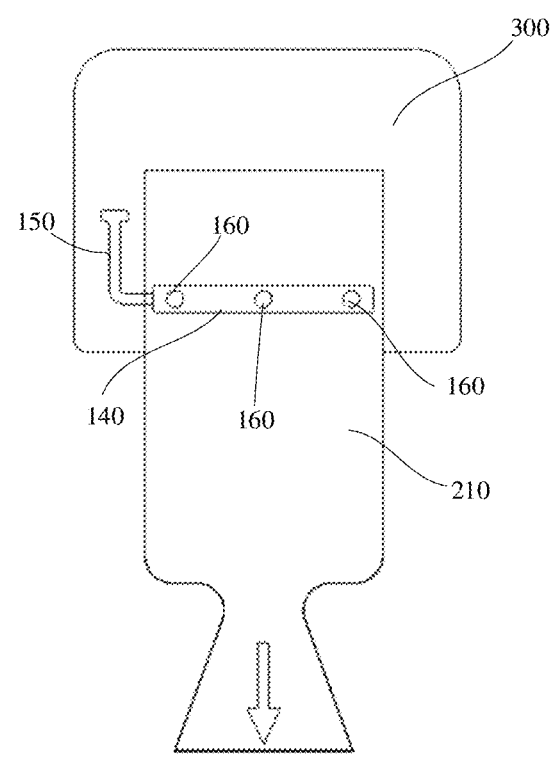
FIG. 4 is a schematic diagram of a portion of an electronic device according to some embodiments of the disclosure.

FIG. 1 is a diagram of a heat sink assembly according to some embodiments of the disclosure, in which a vibrating plate 110 and a vibrating film 120 of the heat sink assembly are connected. The heat sink assembly includes the vibrating plate 110 as shown in FIG. 1, the vibrating film 120 as shown in FIG. 1, a driving device 140 as shown in FIG. 4 and a control circuit 150 as shown in FIG. 4.

The vibrating plate 110 includes a magnetic material.

One end 130 of the vibrating film 120 is connected with the vibrating plate 110.

The driving device 140 has an electromagnet 160 which is arranged opposite to the vibrating plate 110.

The control circuit 150 is connected with the driving device 140 and is configured for transmitting to the driving device 140 a control signal for controlling the electromagnet 160 to be energized and de-energized.

The electromagnet 160 generates a magnetic field that drives the vibrating plate 110 to vibrate when the electromagnet 160 is alternately switched between an energized state and a de-energized state.

The vibrating film 120 vibrates with the vibration of the vibrating plate 110.

In the embodiments of the present disclosure, the electromagnet 160 generates a variable magnetic field that drives the vibrating plate 110 to vibrate during the energizing and the de-energizing of the electromagnet 160, and then the vibrating plate 110 drives the vibrating film 120 to vibrate. The vibration of the vibrating film 120 causes air convection, which has a heat dissipation effect. The heat dissipation mode of air convection can transfer heat in time and improve the heat dissipation effect.

In a specific example, when the electromagnet 160 is energized, the current gradually rises from 0 to the maximum, and a first magnetic field is generated during the gradual rise of the current. When the electromagnet 160 is switched from an energized state to a de-energized state, the current drops from the maximum to 0, and a variable electric field is converted to a variable second magnetic field. The direction of the first magnetic field may be opposite to the direction of the variable second magnetic field. If the first magnetic field attracts the vibrating plate 110 to move in the direction close to the electromagnet 160, the vibrating plate 110 deforms due to its movement, and the vibrating film 120 moves in the same direction as the vibrating plate 110. If the variable second magnetic field causes the vibrating plate 110 to move away from the electromagnet 160, during this process, the vibrating plate 110 may recover from the deformation, and the vibrating film 120 also moves in the same direction as the vibrating plate 110. Alternately energizing and de-energizing the electromagnet 160 can cause the vibrating plate 110 to drive the vibrating film 120 to vibrate.

The vibrating film 120 and the vibrating plate 110 may be connected directly or indirectly, so that the vibrating film 120 is driven by the vibrating plate 110 to vibrate. The density of the vibrating film 120 is less than that of the vibrating plate 110 to obtain a better vibration effect.

In some embodiments, the thickness of the vibrating film 120 may be less than that of the vibrating plate 110.

It is worth noting that at least compared with a heat pipe and a soaking plate, both the vibrating plate 110 and the vibrating film 120 are thinner and lighter, and due to the thin and light structure with low density, vibration with an increased amplitude may occur under the drive of a small driving force, and the vibration with a larger amplitude will better promote the air convection, thus improving the heat dissipation effect. Further, by expanding a coverage area of the vibrating film 120, a heat dissipation area can be increased and the heat dissipation effect can be further improved.

The thickness of the vibrating film 120 may be adjusted according to a heat dissipation requirement of an electronic device provided with the heat sink assembly. Unrestrictedly, the thickness of the vibrating film 120 may be micron scale, for example, a few microns to dozens of microns.

The materials of the vibrating film 120 include, but are not limited to, polymer film or metal film, etc. For example, the vibrating film 120 is polyester film, polyethylene film, polypropylene film, aluminum film or stainless steel film, etc. The film structure of the vibrating film 120 may be made of a wide range of materials, is widely used in medicine and other fields, and is conducive to commercial application of the heat sink assembly.

The magnetic materials of the vibrating plate 110 include, but are not limited to, iron, cobalt, nickel and alloys of iron, cobalt and nickel.

Figure 9:
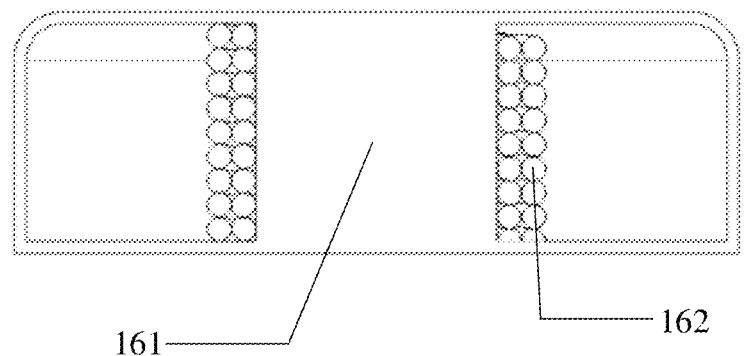
FIG. 9 is a schematic diagram showing a core and a conductive winding of an electromagnet of an electronic device according to some embodiments of the disclosure.

As shown in FIG. 9, the electromagnet 160 includes a core 161 and a conductive winding 162 arranged around the core 161. The core 161 has the magnetic material. By energizing or de-energizing the conductive winding 162, the variable magnetic field radiates outwards from the core 161. Unrestrictedly, iron, cobalt, nickel and alloys of iron, cobalt and nickel are also available for the magnetic materials of the core 161.

In other optional embodiments, the vibrating plate 110 may include a fixing part 111, which is configured for fixing the vibrating plate 110 and a vibrating arm 112.

The vibrating arm 112 is connected to the fixing part 111 and elastically deformable relative to the fixing part 111. One end 130 of the vibrating film 120 is connected to the vibrating arm 112.

Figure 2:
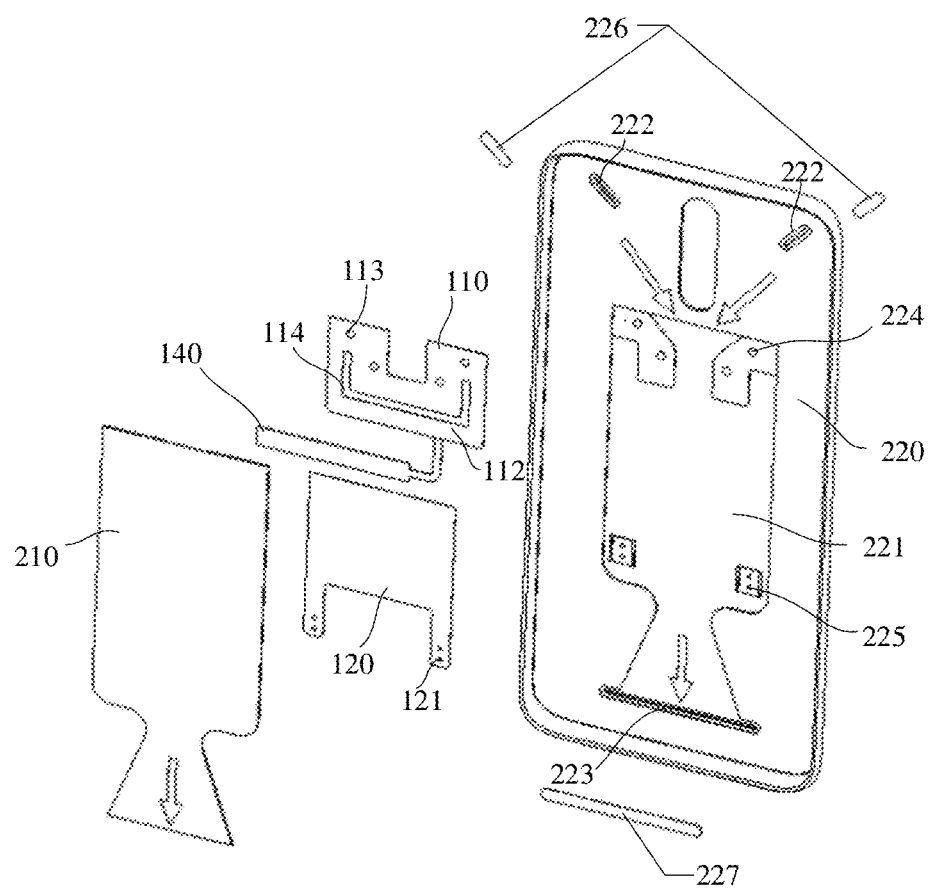
FIG. 2 is an exploded view of a portion of an electronic device according to some embodiments of the disclosure.

As shown in FIG. 1 and FIG. 2, the upper end of the vibrating plate 110 is provided with the fixing part 111, and the lower end of the vibrating plate 110 is provided with the vibrating arm 112. The electromagnet 160 may be arranged opposite to the vibrating arm 112. The variation of the magnetic field generated by the electromagnet 160 drives the vibrating arm 112 to vibrate, and the vibrating film 120 vibrates with the vibration of the vibrating arm 112.

Unrestrictedly, the vibrating arm 112 may be realized in the following way. As shown in FIG. 1 and FIG. 2, an approximately U-shaped opening 114 is provided on the vibrating plate 110, the fixing part 111 is located above the opening 114, and the vibrating arm 112 is located below the opening 114. The fixing part 111 includes a first fixing hole(s) 113, through which fasteners such as screws may pass to fix the vibrating plate 110 in the electronic device.

In other optional embodiments, another end of the vibrating film 120, which is away from the one end 130 of the vibrating film 120 connected to the vibrating plate 110, is provided with a second fixing hole(s) 121. The second fixing hole(s) 121 is configured for fixing the another end of the vibrating film 120 in the electronic device.

Figure 3:
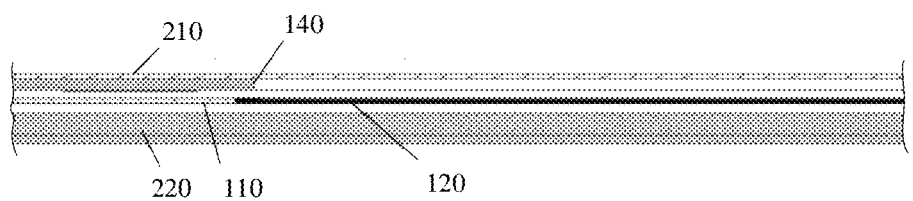
FIG. 3 is a sectional view of a portion of an electronic device according to some embodiments of the disclosure.

As shown in FIG. 2 and FIG. 3, the upper end of the vibrating film 120 may be fixed on the vibrating plate 110, and the lower end of the vibrating film 120 is provided with the second fixing hole(s) 121, through which the fasteners such as screws may pass to fix the vibrating film 120 in the electronic device. The arrangement of the vibrating film 120 and the vibrating plate 110 may be chosen or selected according to the space in the electronic device. For example, for small straight board electronic devices such as mobile phones, the vibrating plate 110 and the vibrating film 120 may be arranged in a straight line as shown in FIG. 1. Alternatively, the vibrating plate 110 and the vibrating film 120 are arranged in an L-shape. Alternatively, the lower end of the vibrating plate 110 is connected with two vibrating films 120, and the vibrating plate 110 and the two vibrating films 120 are arranged in an inverted-T shape.

In other optional embodiments, the vibrating film 120 is connected to the vibrating plate 110 by bonding.

Unrestrictedly, adhesive or double-sided adhesive is applied between the vibrating film 120 and the vibrating plate 110 to bond and fix the vibrating film 120 and the vibrating plate 110. The adhesive may be epoxy resin adhesive or acrylate adhesive.

In other optional embodiments, the control circuit 150 is a flexible printed circuit (FPC).

The FPC is connected with the driving device 140 and is configured for transmitting to the driving device 140 the control signal for controlling the electromagnet 160 to be energized and de-energized.

The FPC has a relatively small thickness, which is conducive to reducing the space occupation of the heat sink assembly. The FPC is provided with the control circuit 150 for controlling the electromagnet 160 to be energized and de-energized. Unrestrictedly, the FPC may use a switch in the control circuit 150 to control the electromagnet 160 to be energized and de-energized and control an energizing and de-energizing frequency of the electromagnet 160 through a switch frequency. Generally, the higher the energizing and de-energizing frequency of the electromagnet 160, the higher the vibration frequency of the vibrating film 120, and the better the heat dissipation effect, and vice versa.

Further, the FPC may adjust the vibration amplitude of the vibrating plate 110 by adjusting the current supplied to the electromagnet 160. Under the same vibration frequency, the larger the vibration amplitude of the vibrating plate 110, the larger the vibration amplitude of the vibrating film 120, and the better the heat dissipation effect, and vice versa.

In other optional embodiments, the vibrating plate 110 is a metal plate.

The metal plate is a metal or alloy plate including the magnetic materials, such as iron, cobalt and nickel and the like.

The embodiments of the present disclosure also provide a control method for the heat sink assembly described in any above embodiment, which includes the following operations.

A periodic control signal, which controls the electromagnet 160 to be energized and de-energized alternately, is sent by the control circuit 150.

The electromagnet 160 generates a variable magnetic field that drives the vibrating plate 110 to vibrate during the energizing and the de-energizing of the electromagnet 160. The variable magnetic field drives the vibrating plate 110 including the magnetic material to move to drive the vibrating film 120 connected with the vibrating plate 110.

Generally, a motherboard of the electronic device provided with the heat sink assembly alternately sends a first control signal and a second control signal, and the FPC transmits the first control signal and the second control signal to the driving device 140.

In practical applications, when the temperature in the electronic device reaches a preset value, or when a preset function device of the electronic device is started, for example, when a game function device is started, the electromagnet 160 is alternately energized or de-energized. Further, when the game function device is started, the motherboard in the electronic device provided with the heat sink assembly alternately sends the first control signal and the second control signal.

Those of ordinary skill in the art should know that all or part of the steps of the method embodiment may be implemented by related hardware instructed through a program, the program may be stored in a computer-readable storage medium, and the program is executed to execute the steps of the method embodiment. The storage medium includes various media capable of storing program codes such as a mobile storage device, a Read-Only Memory (ROM), a Random Access Memory (RAM), a magnetic disk or a compact disc.

Based on the device embodiments above, the embodiments of the present disclosure provide specific hardware, including a processor, a storage medium, and at least one external communication interface. The processor, the storage medium and the external communication interface are all connected through a bus. The processor may be electronic components with a processing function, such as a microprocessor, a central processing unit, a digital signal processor or a programmable logic array. A computer executable code is stored in the storage medium. When executing the computer executable code, the processor can at least realize the following functions: the control circuit 150 sends a periodic control signal that controls the electromagnet 160 to be energized and de-energized.

The embodiments of the present disclosure also provide an electronic device, which may include the heat sink assembly described in any above embodiment, a shell 220 and a cover plate 210.

An end of the vibrating plate 110, which is away from the end 130 of the vibrating plate 110 connected to the vibrating film 120, is fixed on the shell 220. Another end of the vibrating film 120, which is away from the end 130 of the vibrating film 120 connected to the vibrating plate 110, is fixed on the shell 220.

The cover plate 210 is installed on the shell 220. The driving device 140 is installed at the inner side of the cover plate 210 facing the shell 220, and the vibrating plate 110 and the vibrating film 120 are located between the cover plate 210 and the shell 220.

As shown in FIG. 2 to FIG. 7, there is an accommodating space between the shell 220 and the cover plate 210. The accommodating space is configured for accommodating the electromagnet 160, the vibrating plate 110, the vibrating film 120, etc. and provides space for the vibration of the vibrating plate 110 and the vibrating film 120. The vibrating plate 110 and the vibrating film 120 are fixed on the shell 220, and the electromagnet 160 is fixed on the cover plate 210.

In a specific example, the shell 220 is a rear shell, and the cover plate 210 is in the electronic device and encapsulated at the inner side of the rear shell. The accommodating space with an air opening is formed between the cover plate 210 and the rear shell, and battery, motherboard and other components in the electronic device are arranged outside the accommodating space. When the vibrating plate 110 in the accommodating space drives the vibrating film 120 to vibrate, the airflow inside and outside the accommodating space is convective through the air opening, which dissipates heat from a heat source inside the electronic device. The heat source refers to any electronic component, which can generate heat, in the electronic device, including but not limited to chips, batteries, etc.

The heat sink assembly is integrated on the shell 220 by means of the cover plate 210, which is convenient for modular manufacturing and assembly of the electronic device.

In the embodiments of the present disclosure, the electronic devices include mobile terminals and fixed terminals. The mobile terminals include a mobile terminal, a laptop, a tablet personal computer (PC), a drone, a wearable electronic device, etc. The fixed terminals include a personal computer, a television, etc.

In other optional embodiments, the shell 220 is provided with an air inlet 222, an air outlet 223, and a groove 221 arranged between the air inlet 222 and the air outlet 223. The groove 221 accommodates the vibrating plate 110 and the vibrating film 120.

The cover plate 210 covers the groove 221 and forms an air duct with the groove 221. The air duct is connected with each of the air inlet 222 and the air outlet 223. The air duct is the space where a heat dissipation medium (for example, air) flows. The air duct is connected with each of the air inlet 222 and the air outlet 223, thus forming a transmission channel for heat exchange between the device and the outside.

Figure 5:
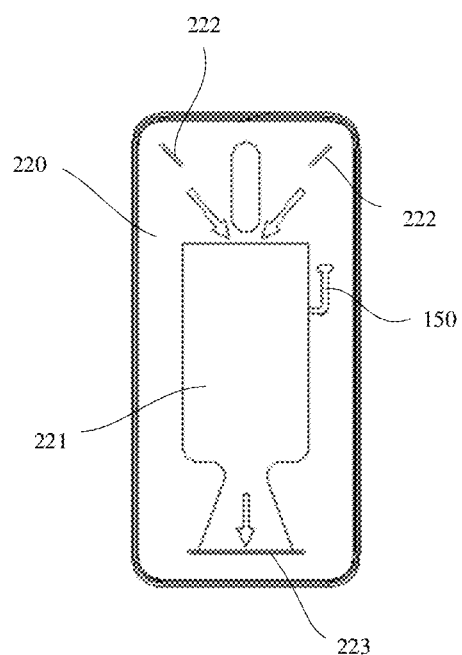
FIG. 5 is another schematic diagram of a portion of an electronic device according to some embodiments of the disclosure.
Figure 6:
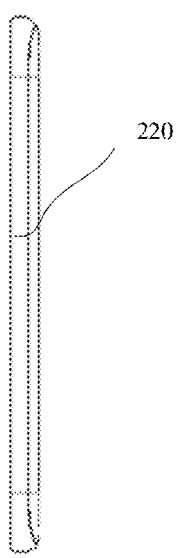
FIG. 6 is a further schematic diagram of a portion of an electronic device according to some embodiments of the disclosure.
Figure 7:
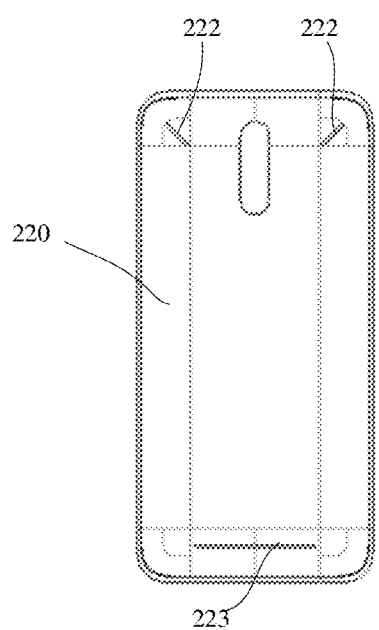
FIG. 7 is a still further schematic diagram of a portion of an electronic device according to some embodiments of the disclosure.

With reference to FIG. 5 to FIG. 7, FIG. 5 shows a diagram of inner surface of the shell 220, and FIG. 7 shows a diagram of the outer surface of the shell 220. The air inlet 222 and the air outlet 223 are arranged to realize the communication between the internal space of the electronic device and the external environment. At this point, the accommodating space for accommodating the vibrating plate 110 and the vibrating film 120 is mainly provided by the groove 221. The accommodating space is reused as the air duct. The air duct is connected with the air inlet 222 and the air outlet 223 through the air opening. When the vibrating film 120 vibrates, air with lower ambient temperature enters the air duct from the air inlet 222. Because the air duct is located in the electronic device, the air entering the air duct takes heat away from the electronic device and turns into an air flow with a relatively high temperature, which is removed out of the electronic device through the air outlet 223.

In order to improve the heat dissipation effect, the air inlet 222 and the air outlet 223 are arranged apart from each other. For example, the air inlet 222 and the air outlet 223 are arranged opposite to each other. Compared with the adjacent air inlet 222 and air outlet 223, the air inlet 222 and the air outlet 223 arranged opposite to each other can obtain a better heat dissipation effect. Moreover, the air inlet 222 and the air outlet 223 may be located on the same surface of the shell 220 or on different surfaces of the shell 220. For example, the air inlet 222 is located on the side surface of the shell 220, and the air outlet 223 is located on the back surface of the shell 220; or, the air inlet 222 is located on the back surface of the shell 220, and the air outlet 223 is located on the side surface of the shell 220.

Space is reserved for the air duct in the form of the groove 221. When the cover plate 210 is covered on the groove 221, the cover plate 210 does not protrude too much towards the inner side of shell 220, or even does not protrude out of the inner side of shell 220, but is flush with the inner surface of shell 220, thus reducing the occupation of internal space of the electronic device. Moreover, the vibrating film 120 in the embodiments of the present disclosure is relatively thin and light, and the space required for the vibrating film 120 to vibrate is correspondingly small. Such a vibration mode of the vibrating film 120 also reduces the requirement for the space inside the air duct to a certain extent.

As shown in FIG. 2, the groove 221 is provided with a first connection hole(s) 224 corresponding to the first fixing hole(s) 113 on the vibrating plate 110 and a second connection hole(s) 225 corresponding to the second fixing hole(s) 121 on the vibrating film 120. The vibrating plate 110 may be fixed with the shell 220 by threading the fasteners such as the screws through the first fixing hole(s) 113 on the vibrating plate 110 and the first connection hole(s) 224, and the vibrating film 120 may be fixed with the shell 220 by threading the fasteners such as the screws through the second fixing hole(s) 121 on the vibrating film 120 and the second connection hole(s) 225.

Optionally, as shown in FIG. 5, the air inlet 222 is located at one end of the air duct and the air outlet 223 is located at another end of the air duct opposite to the one end of the air duct, and the two opposite ends of the air duct are provided with the air openings. Moreover, two sides of the air duct may also be provided with the air openings.

In a specific example, the shell 220 may not be provided with the groove 221, and the cover plate 210 arches away from the shell 220 to form the air duct between the arched cover plate 210 and the shell 220. At this point, the vibrating plate 110 and the vibrating film 120 are fixed on a joint surface of the shell 220 opposite to the cover plate 210.

In other optional embodiments, the electronic device may further include a protection film 226, 227 with an air vent. The protection film 226, 227 is located at the rear side of the shell 220 away from the cover plate 210 and is covered on the air inlet 222 and the air outlet 223.

The protection film 226, 227 has liquid sealing but not gas sealing. The liquid sealing of the protection film 226, 227 may prevent water in the external environment from entering the electronic device through the air inlet 222 and the air outlet 223 but allow air and other airflow to pass through the air inlet 222 and the air outlet 223, thus ensuring the heat dissipation effect. Moreover, the liquid sealing of the protection film 226, 227 may also prevent dust and other impurities from entering the electronic device, thus achieving a dust-proof effect.

Unrestrictedly, the protection film 226, 227 is polymer film.

In other optional embodiments, the shell 220 is the rear shell.

In a specific example, as shown in FIG. 5 and FIG. 7, the rear shell is a rectangular shell 220. The upper part of the rear shell is provided with two air inlets 222. The two air inlets 222 are arranged along the diagonal direction of the shell 220. The air outlet 223 is arranged horizontally at the bottom of the rear shell. When the vibrating film 120 vibrates, the direction of air flow corresponds to the arrows in FIG. 5.

In other optional embodiments, the electronic device may further include a motherboard 300 connected with the driving device 140.

The motherboard 300 usually includes a central processing unit (CPU), a chip set, an embedded controller, etc. connected by a bus, and of course, the motherboard 300 may include other common devices. The motherboard 300 alternately sends the first control signal and the second control signal, and the FPC transmits the first control signal and the second control signal to the driving device 140. The first control signal is configured for controlling the electromagnet 160 to be energized, and the second control signal is configured for controlling the electromagnet 160 to be de-energized.

Figure 8:
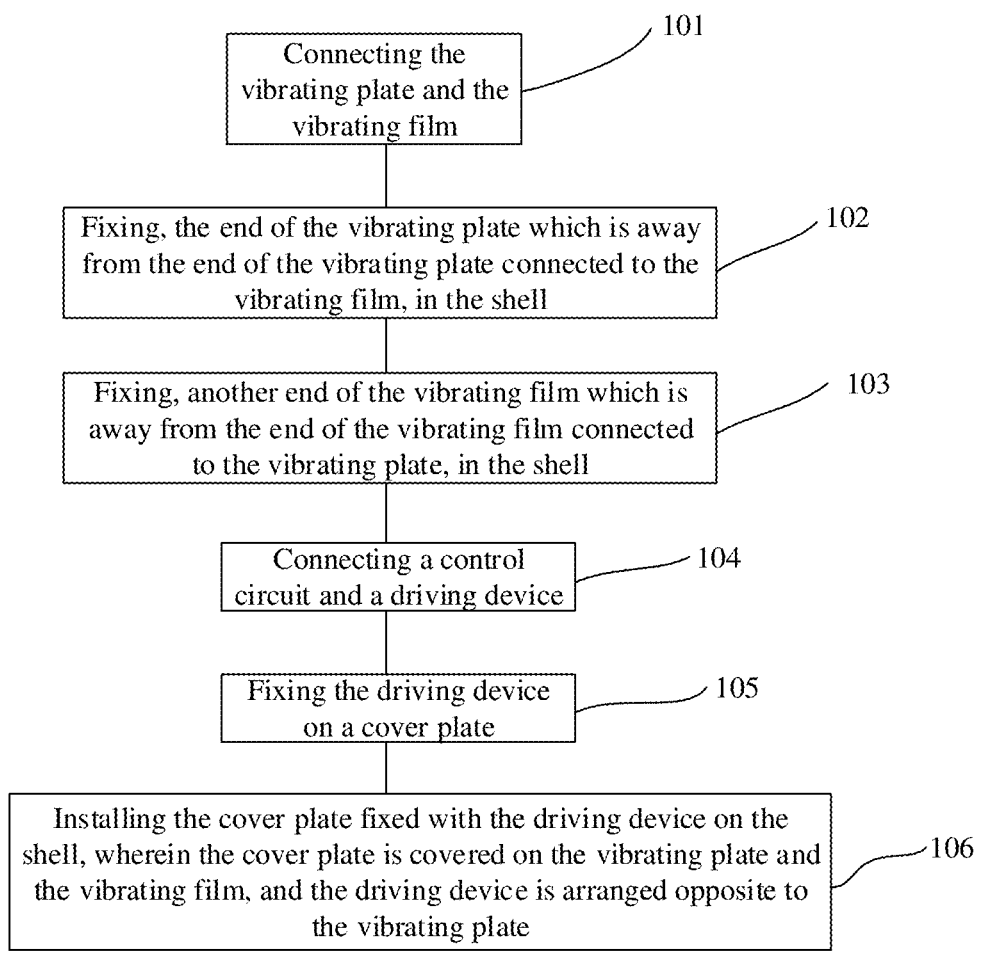
FIG. 8 is a flowchart of a manufacturing method for an electronic device according to some embodiments of the disclosure.

The embodiments of the present disclosure also provide a manufacturing method for the electronic device described in any above embodiment. As shown in FIG. 8, the manufacturing method may include the following steps.

At S101, the vibrating plate 110 and the vibrating film 120 are connected.

At S102, the end of the vibrating plate 110, which is away from the end 130 of the vibrating plate 110 connected to the vibrating film 120, is fixed in the shell 220.

At S103, another end of the vibrating film 120, which is away from the end 130 of the vibrating film 120 connected to the vibrating plate 110, is fixed in the shell 220.

At S104, the control circuit 150 and the driving device 140 are connected.

At S105, the driving device 140 is fixed on the cover plate 210.

At S106, the cover plate 210 fixed with the driving device 140 is installed on the shell 220. The cover plate 210 is covered on the vibrating plate 110 and the vibrating film 120, and the driving device 140 is arranged opposite to the vibrating plate 110.

In the embodiments of the present disclosure, the vibrating plate 110 may be connected to the vibrating film 120 by bonding. S101, S102 and S103 involve the connection of the vibrating plate 110 and the vibrating film 120, and S104 and S105 involve the connection of the control circuit 150, the driving device 140 and the cover plate 210. In the actual manufacturing, the connection of the vibrating plate 110 and the vibrating film 120, as well as the connection of the control circuit 150, the driving device 140 and the cover plate 210 has no sequence. That is, S104 and S105 may be performed first, and then S101, S102 and S103 are performed. In addition, there is no specific sequence among S101, S102, and S103. For example, S101, S102, and S103 can also be in order of operation: S101, S103 and S102, or S102, S103 and S101. There is also no specific sequence between S104 and S105.

In other optional embodiments, the manufacturing method may further include the following operations.

The groove 221 is formed on the inner side of the shell 220. The groove 221 is configured for accommodating the vibrating plate 110 and the vibrating film 120 and forms the air duct with the cover plate 210.

The air inlet 222 and the air outlet 223 are formed on the shell 220. The air inlet 222 is located at one side of the groove 221 and the air outlet 223 is located at another side of the groove 221 opposite to the one side of the groove 221, and each of the air inlet 222 and the air outlet 223 is connected with the air duct.

In actual manufacturing, the number and position of the air inlet 222 and the air outlet 223 may be adjusted according to needs. After the vibrating plate 110 and the vibrating film 120 are fixed in the groove 221, the cover plate 210 fixed with the electromagnet 160 is covered on the groove 221.

In other optional embodiments, the manufacturing method may further include the following operations.

The protection film 226, 227 with the air vent is covered on the air inlet 222, which is at the rear side of the shell 220.

The protection film 226, 227 with the air vent is covered on the air outlet 223, which is at the rear side of the shell 220.

In actual manufacturing, each of the air inlet 222 and the air outlet 223 is covered with the protection film 226, 227, which is configured for preventing water and dust from the external environment from entering the electronic device through the air inlet 222 and the air outlet 223.

In other optional embodiments, the manufacturing method may further include the following operations.

The control circuit 150 and the motherboard 300 are connected.

As shown in FIG. 2, FIG. 4 and FIG. 5, when the control circuit 150 is the FPC, the motherboard 300 is indirectly connected with the driving device 140 through the FPC.

In a specific example, in the case where the electronic device is a mobile phone for example, the vibrating plate 110, which may be made of metal, is bonded with the vibrating film 120 to form a vibrating assembly. The vibrating plate 110 has a vibrating arm 112, which is elastically deformable up and down, thus driving the vibrating film 120 to flap up and down. As shown in FIG. 1, the driving device 140 is fixed on the encapsulating cover plate 210. As shown in FIG. 4, the vibrating assembly and the driving device 140 are integrated on the rear shell of the mobile phone. A control device of the motherboard 300 of the mobile phone controls the electromagnet 160 on the driving device 140 to be energized and de-energized through the FPC, and the electromagnet 160 produces magnetic variation, thus producing periodic actions of suction and disconnection to the vibrating plate 110. The vibrating plate 110 moves up and down to drive the vibrating film 120 to flap up and down, thus producing the movement of internal airflow. Combined with the design of the air duct, the air inlet 222 and the air outlet 223 on the rear shell of the mobile phone, a complete air cooling heat dissipation solution inside the mobile phone is produced.

The technical solutions provided in the embodiments of the present disclosure may have the following beneficial effects.

It can be seen from the above embodiments that the vibrating film and the vibrating plate are connected, thus the vibrating film will be driven by the vibrating plate to vibrate, thereby producing air convection. Due to the light and thin structure of both the vibrating plate and the vibrating film, not only is the space occupation of the heat sink assembly reduced, but also the vibrating plate may drive the vibrating film to generate a vibration with an increased amplitude under a small driving force, and the vibration with a large amplitude will better promote the air convection, thus improving the heat dissipation effect.

Other implementation solutions of the present disclosure will be apparent to those skilled in the art from consideration of the description and practice of the present disclosure. This present disclosure is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the claims.

It will be appreciated that the present disclosure is not limited to the exact construction that has been described above and illustrated in the accompanying drawings, and that various modifications and changes may be made without departing from the scope thereof. It is intended that the scope of the present disclosure only be limited by the appended claims.

What is claimed is:

1. A heat sink assembly of an electronic device, comprising:
    a vibrating plate comprising a magnetic material;
    a vibrating film, wherein one end of the vibrating film is connected with the vibrating plate;
    a driving device having an electromagnet which is arranged opposite to the vibrating plate; and
    a control circuit, which is connected with the driving device and configured for transmitting to the driving device a control signal for controlling the electromagnet to be energized and de-energized;
    wherein the electromagnet generates a magnetic field that drives the vibrating plate to vibrate when the electromagnet is alternately switched between an energized state and a de-energized state;
    wherein the vibrating film vibrates with the vibration of the vibrating plate;
    wherein the vibrating plate comprises:
        a fixing part configured for fixing the vibrating plate, the fixing part comprising a first fixing hole for passage of a fastener to fix the vibrating plate in the electronic device; and
        an elastic vibrating arm connected with the fixing part, wherein the elastic vibrating arm is elastically deformable relative to the fixing part, and the one end of the vibrating film is connected with the elastic vibrating arm;
    wherein a density of the vibrating film is less than a density of the vibrating plate;
    wherein the vibrating film is polyethylene film, polypropylene film, aluminum film or stainless steel film.

2. The heat sink assembly of the electronic device of claim 1, wherein another end of the vibrating film, which is away from the one end of the vibrating film connected with the vibrating plate, is provided with a second fixing hole configured for fixing the another end of the vibrating film.

3. The heat sink assembly of the electronic device of claim 1, wherein the vibrating film is connected with the vibrating plate by bonding.

4. The heat sink assembly of the electronic device of claim 1, wherein the control circuit is a flexible printed circuit.

5. The heat sink assembly of the electronic device of claim 1, wherein the vibrating plate is a metal plate.

6. A control method for a heat sink assembly of an electronic device, the heat sink assembly comprising:
    a vibrating plate comprising a magnetic material;
    a vibrating film, wherein one end of the vibrating film is connected with the vibrating plate;
    a driving device having an electromagnet which is arranged opposite to the vibrating plate; and
    a control circuit, which is connected with the driving device and configured for transmitting to the driving device a control signal for controlling the electromagnet to be energized and de-energized;
    wherein the electromagnet generates a magnetic field that drives the vibrating plate to vibrate when the electromagnet is alternately switched between an energized state and a de-energized state;
    wherein the vibrating film vibrates with the vibration of the vibrating plate;
    wherein the vibrating plate comprises:
        a fixing part configured for fixing the vibrating plate, the fixing part comprising a first fixing hole for passage of a fastener to fix the vibrating plate in the electronic device; and
        an elastic vibrating arm connected with the fixing part, wherein the elastic vibrating arm is elastically deformable relative to the fixing part, and the one end of the vibrating film is connected with the elastic vibrating arm;
    wherein a density of the vibrating film is less than a density of the vibrating plate;
    wherein the vibrating film is polyethylene film, polypropylene film, aluminum film or stainless steel film;
    wherein the control method comprises:
        sending, by the control circuit, a periodic control signal which controls the electromagnet to be energized and de-energized alternately;
    wherein the electromagnet generates a variable magnetic field that drives the vibrating plate to vibrate during the energizing and the de-energizing of the electromagnet to drive the vibrating film connected with the vibrating plate.

7. An electronic device, comprising:
a heat sink assembly comprising:
    a vibrating plate comprising a magnetic material;
    a vibrating film, wherein one end of the vibrating film is connected with the vibrating plate;
    a driving device having an electromagnet which is arranged opposite to the vibrating plate; and
    a control circuit, which is connected with the driving device and configured for transmitting to the driving device a control signal for controlling the electromagnet to be energized and de-energized;
    wherein the electromagnet generates a magnetic field that drives the vibrating plate to vibrate when the electromagnet is alternately switched between an energized state and a de-energized state;
    wherein the vibrating film vibrates with the vibration of the vibrating plate;
    wherein the vibrating plate comprises:
        a fixing part configured for fixing the vibrating plate, the fixing part comprising a first fixing hole for passage of a fastener to fix the vibrating plate in the electronic device; and
        an elastic vibrating arm connected with the fixing part, wherein the elastic vibrating arm is elastically deformable relative to the fixing part, and the one end of the vibrating film is connected with the elastic vibrating arm;
    wherein a density of the vibrating film is less than a density of the vibrating plate;
    wherein the vibrating film is polyethylene film, polypropylene film, aluminum film or stainless steel film;
a shell, wherein an end of the vibrating plate, which is away from an end of the vibrating plate connected with the vibrating film, is fixed on the shell, and another end of the vibrating film, which is away from the one end of the vibrating film connected with the vibrating plate, is fixed on the shell; and a cover plate arranged on the shell, wherein the driving device having the electromagnet is arranged at an inner side of the cover plate facing the shell, and the vibrating plate and the vibrating film are located between the cover plate and the shell.

8. The electronic device of claim 7, wherein the shell is provided with an air inlet, an air outlet, and a groove between the air inlet and the air outlet, the groove accommodating the vibrating plate and the vibrating film, wherein the cover plate is covered on the groove and forms an air duct with the groove, and the air duct is connected with each of the air inlet and the air outlet.

9. The electronic device of claim 8, further comprising a protection film, which has an air vent, is located at a rear side of the shell away from the cover plate, and is covered on the air inlet and the air outlet.

10. The electronic device of claim 7, wherein the shell is a rear shell.

11. The electronic device of claim 7, further comprising a motherboard connected with the driving device.

* * * * *